(12) United States Patent
Hosoya et al.

(10) Patent No.: US 11,145,644 B2
(45) Date of Patent: Oct. 12, 2021

(54) POWER DEVICE WITH CARRIER LIFETIME ZONE

(71) Applicant: SEMICONDUCTOR COMPONENTS INDUSTRIES, LLC, Phoenix, AZ (US)

(72) Inventors: Takumi Hosoya, Ota (JP); Hiromichi Inenaga, Ota (JP); Seiji Miyoshi, Ota (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/666,727

(22) Filed: Oct. 29, 2019

(65) Prior Publication Data

US 2021/0050344 A1 Feb. 18, 2021

Related U.S. Application Data

(60) Provisional application No. 62/885,879, filed on Aug. 13, 2019.

(51) Int. Cl.
*H01L 27/06* (2006.01)
*H01L 29/10* (2006.01)
*H01L 29/417* (2006.01)
*H01L 29/45* (2006.01)
*H01L 29/739* (2006.01)
*H01L 29/06* (2006.01)
(Continued)

(52) U.S. Cl.
CPC ........ *H01L 27/0635* (2013.01); *H01L 21/266* (2013.01); *H01L 21/26513* (2013.01); *H01L 29/0696* (2013.01); *H01L 29/1095* (2013.01); *H01L 29/41741* (2013.01); *H01L 29/45* (2013.01); *H01L 29/6609* (2013.01); *H01L 29/66348* (2013.01); *H01L 29/7397* (2013.01); *H01L 29/861* (2013.01)

(58) Field of Classification Search
CPC ............. H01L 27/0635; H01L 29/0696; H01L 29/1095; H01L 29/41741; H01L 29/45; H01L 29/6609; H01L 29/66348
See application file for complete search history.

(56) References Cited

U.S. PATENT DOCUMENTS

2007/0231973 A1 10/2007 Ruething et al.
2016/0380068 A1* 12/2016 Nobukuni ........... H01L 29/0619
257/76
(Continued)

FOREIGN PATENT DOCUMENTS

JP 2013-197306 9/2013

*Primary Examiner* — Marc Anthony Armand
(74) *Attorney, Agent, or Firm* — AMPACC Law Group, PLLC (57) ABSTRACT

A power device includes a substrate including a drift layer and having a first region and a second region, the drift layer having impurities of a first type; a switch formed in the first region; a diode formed in the second region; a metal structure formed over a surface of the substrate, the metal structure having a first thickness over the first region of the substrate and a second thickness over the second region of the substrate, the first thickness and second thickness having at least 3 um in thickness difference; and a zone provided in the drift layer in the second region of the substrate, the zone having impurities of a second type that is different from the first type.

20 Claims, 8 Drawing Sheets

(51) Int. Cl.
*H01L 29/66* (2006.01)
*H01L 21/266* (2006.01)
*H01L 21/265* (2006.01)
*H01L 29/861* (2006.01)

(56) References Cited

U.S. PATENT DOCUMENTS

2017/0141103 A1* 5/2017 Kameyama ............. H01L 29/78
2018/0047725 A1* 2/2018 Yoshida ............... H01L 27/0716
2019/0096989 A1* 3/2019 Yoshida ............... H01L 29/7397

* cited by examiner

POWER DEVICE WITH CARRIER LIFETIME ZONE

CROSS-REFERENCE TO RELATED APPLICATIONS

This application claims the benefit of U.S. Provisional Patent Application No. 62/885,879, filed on Aug. 13, 2019, the entire contents of which is incorporated herein by reference.

BACKGROUND OF THE INVENTION

The present disclosure relates to a power semiconductor device having a switch and a diode integrated in a monolithic substrate.

Power semiconductor devices are used in many different industries. Some of these industries, such as telecommunications, computing, and charging systems, are rapidly developing. Those industries would benefit from improved semiconductor device characteristics, including reliability, switching speed, and miniaturization.

Power semiconductor devices, e.g., insulated gate bipolar transistors (IGBTs), are often used as switches. An inductor used in a power conversion system generates induced electromotive force that opposes the current change when the IGBT is turned off. A freewheeling diode may be connected antiparallel to the IGBT to counter this electromotive force. A reverse-conducting IGBT (RC-IGBT) offers an attractive solution for the IGBT modules by integrating an IGBT and a diode e.g., in a monolithic chip.

BRIEF SUMMARY OF THE INVENTION

In an embodiment, a power device includes a substrate including a drift layer and having a first region and a second region, the drift layer having impurities of a first type; a switch formed in the first region; a diode formed in the second region; a metal structure formed over a surface of the substrate, the metal structure having a first thickness over the first region of the substrate and a second thickness over the second region of the substrate, the first thickness and second thickness having at least 3 um in thickness difference; and a zone provided in the drift layer in the second region of the substrate, the drift layer having impurities of a second type that is different from the first type.

In an embodiment, the surface is a front side of the substrate, and the metal structure includes an electrode and an implantation mask that is formed on the electrode. The zone is a carrier lifetime zone configured to improve an operational characteristic of the diode. The electrode and the implantation mask include the same metal. The electrode and the implantation mask include aluminum.

In an embodiment, the switch is a reverse-conducting insulated-gate bipolar transistor (IGBT).

In an embodiment, the first thickness is at least 8 um, and the second thickness is at least 4 um.

In an embodiment, the surface of the substrate is a backside of the substrate, and the metal structure is a metal layer having a groove configured to allow impurities to be implanted into the second region of the substrate to form the zone.

In an embodiment, the diode is a fast recovery diode.

In another embodiment, a power device includes a switch provided in a first region of a substrate; a diode formed in a second region of the substrate; first and second metal electrodes formed over first and second surfaces of the substrate, respectively; an implantation mask formed on the first metal electrode to prevent impurities from being implanted into the first region; and a zone provided in the second region of the substrate, the zone having impurities implanted in the second region to improve a switching speed of the diode.

In another embodiment, the implantation mask is a metal pattern formed on the first electrode. The implantation mask pattern includes aluminum.

In another embodiment, the implantation mask has a thickness greater than that of the first electrode and the switch is an insulated-gate bipolar transistor (IGBT).

In another embodiment, the implantation mask has a thickness of at least 4 um.

In another embodiment, the implantation mask covers only the first region of the substrate wherein the IGBT is formed.

In another embodiment, the device further includes a drift layer provided in the substrate. The drift layer has impurities of a first type. The impurities in the zone are a second type that is different from the first type.

In yet another embodiment, a method for fabricating a power device includes providing a substrate including a drift layer and having a first region and a second region; forming a switch and the diode in the first region and the second region, respectively; forming an implantation mask over the substrate, the implantation mask configured to prevent impurities from being implanted in the first region; and irradiating impurities over the substrate to form a zone in the drift layer in the second region to improve the switching speed of the diode, the implantation mask preventing the impurities from being implanted into the first region.

In yet another embodiment, the method further includes forming a first electrode layer over a first side of the substrate, the first electrode layer provided proximate to an anode of the diode; and forming a second electrode layer over a second side of the substrate, the second electrode layer provided proximate to a cathode of the diode, wherein the implantation mask includes metal.

In yet another embodiment, the implantation mask is formed over the first electrode layer and has a thickness of at least 4 um. The first electrode layer and the implantation mask include aluminum.

In yet another embodiment, the second electrode layer has a first thickness over the first region and a second thickness over the second region, the first thickness being thicker than the second thickness and defining the implantation mask.

DETAILED DESCRIPTION OF THE INVENTION

Embodiments of the present application relate to an integrated power semiconductor device having a switch and a diode formed on a monolithic chip or substrate. Although the switch may be an IGBT or power MOSFET, the embodiments are illustrated using an IGBT, e.g., reverse-conducting IGBT. The diode may be a fast recovery diode arranged antiparallel to the IGBT. A fast recovery diode has a quick recovery time (e.g., nanoseconds) for its use in high frequency applications.

In an embodiment, the power semiconductor has an IGBT and a fast recovery diode (FRD) formed on the same substrate. The diode assists with the turn-off characteristics of the IGBT. The power device is treated with lifetime control to improve the switching speed of the diode. The lifetime control treatment involves implanting impurities (e.g., helium ions) in the diode region of the substrate. Helium ions are prevented from being implanted in the IGBT region since they will deteriorate the forward performance of the IGBT.

A patterned implantation mask is formed on the power device (e.g., on a metal electrode layer) to protect the IGBT region during the lifetime control treatment when helium ions are implanted into the diode region. The mask is formed using a photolithtography method. Accordingly, a precise alignment is possible, e.g., less than 1 um in control variation. In comparison, a positional deviation can be about 100 um when a metal plate is used as in a conventional method, which can be problematic particularly for integrated power devices having small dimensions.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Figure 1A:
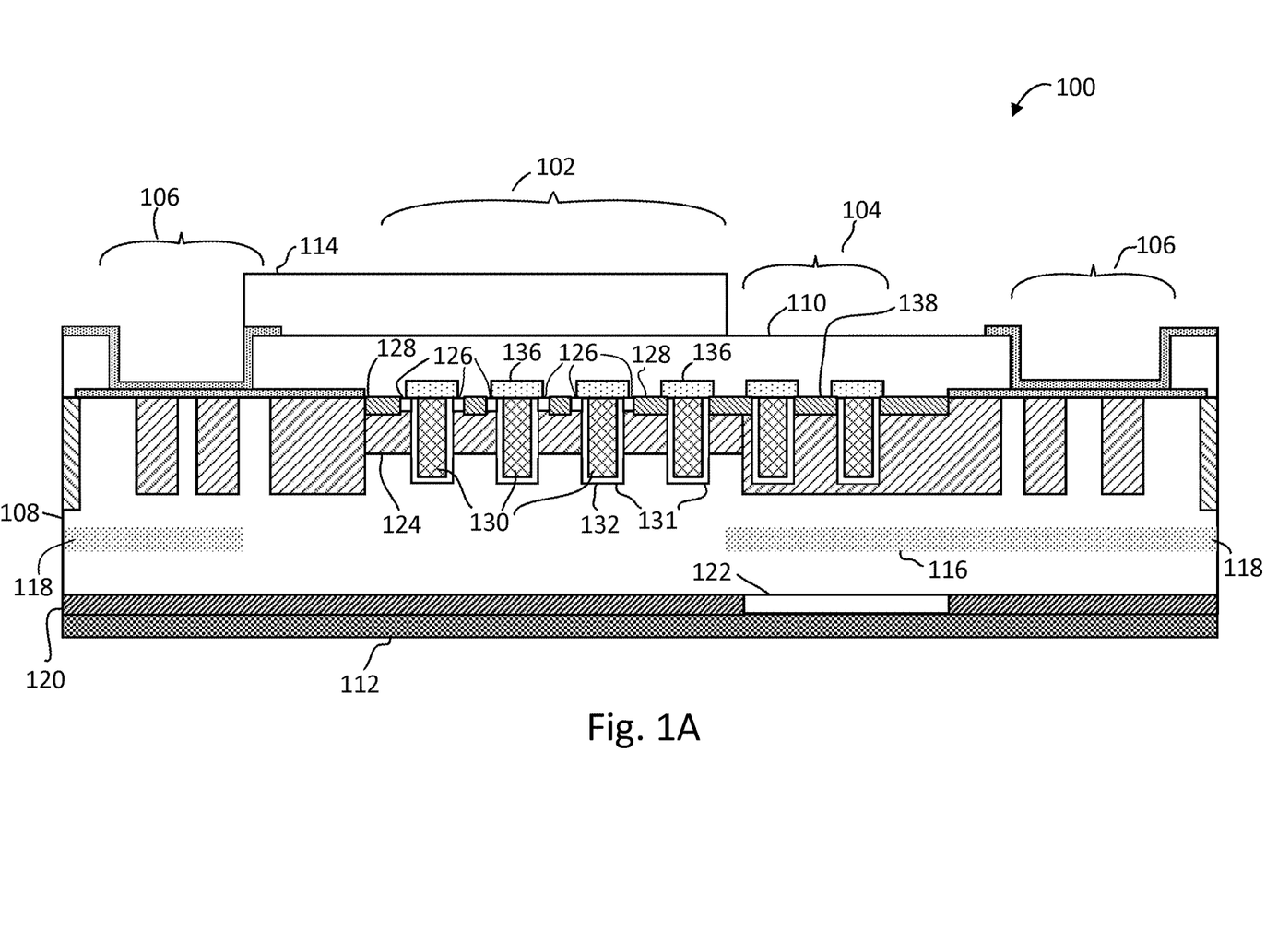
FIG. 1A illustrates a power semiconductor device according to an embodiment.

FIG. 1A illustrates a power semiconductor device 100 according to an embodiment. The power semiconductor device 100 has a switch 102, a diode 104, and a guard region 106. The switch may be a MOSFET, IGBT, or the like; however, the switch will be described hereinafter as an IGBT, in particular as a reverse-conducting IGBT having a trench gate type structure. The diode 104 is a fast recovery diode provided adjacent to the guard region 106. In an embodiment, the power device 100 is an integrated power device having the IGBT 102 and the diode 104 formed on a monolithic chip or substrate 108. The diode 104 assists with the turn-off characteristic of IGBT 102. In an embodiment, the diode is a fast recovery diode for use in high frequency applications. The guard region 106 surrounds the IGBT 102 and the diode 104 at the periphery of the substrate 108.

The power device 100 has a drift region (or drift layer) of the n-type defined in the substrate 108. Bulk of the substrate serves as the drift region. Accordingly, the drift region may also be referred to as the substrate 108. A first metal electrode 110 is provided over the substrate 108 and serves as an emitter electrode for the IGBT and an anode electrode for the diode. A second metal electrode 112 is provided below the substrate 108 and serves as a collector electrode for the IGBT and a cathode electrode for the diode. In an embodiment, the first metal electrode 110 includes aluminum, and the second metal electrode 112 includes a different metal than the first metal electrode. Alternatively, both electrodes may include the same metal, e.g., aluminum. In a specific embodiment, the first metal electrode 110 includes aluminum and has a thickness of about 4 um, and the second metal electrode 112 includes aluminum, titanium, nickel, and silver and has a thickness of about 2 um (e.g., an aluminum layer of 800 nm, a titanium layer of 150 nm, a nickel layer of about 200 nm, and a silver layer of about 800 nm).

In an embodiment, an implantation mask 114 is provided over the first metal electrode 108, covering the IGBT region. The mask 114 is used to protect the IGBT region when the diode region is irradiated or implanted with helium ions or protons for lifetime control treatment, where the irradiation is performed on the front side of the power device 100. The mask 114 is formed using a photolithography process, which enables a precise alignment control. The mask 114 may be a metal or other relatively dense material suitable for protecting the IGBT region while the diode region is being irradiated with helium ions. In an embodiment, the mask pattern 114 includes the same metal (e.g., aluminum) as the first metal electrode 112. In an embodiment, the mask pattern is at least as thick as the first metal electrode. For example, the first metal electrode is 4 um, and the mask pattern is 5 um.

In an embodiment, the mask pattern 114 only covers the IGBT region and exposes the guard region 106 as well as the diode region. The helium ions are implanted in the guard region 106 during the lifetime control treatment. Dopant concentration of the doped region in the guard region 106 may be adjusted to optimize the characteristics of the power device.

The power device 100 includes a zone 116 where helium ions are provided therein to provide lifetime control in the diode region. A zone 118 is also provided in the guard region 106. In an embodiment, the zones 116 and 118 are provided in the drift layer of the power device 100. The IGBT region is free of such a zone since the implantation mask 114 protects the IGBT region from the irradiation during the lifetime control treatment, thereby preventing the IGBT's forward performance from being deteriorated.

The zone 116 (or carrier lifetime control zone) reduces lifetime for charge carriers to improve the switching speed of the diode 104 for its use in high frequency applications. Defect-causing particles (e.g., helium ions) implanted in the zone reduce the lifetime of the charge carriers.

A collector 120 of the IGBT 102 and a cathode 122 of the diode 104 are provided at the backside of the substrate 108 contacting the second metal electrode 112. In an embodiment, the collector 120 is a highly doped p-type layer, and the cathode 122 is a highly dope n-type layer.

A base region 124 of a p-type conductivity is formed proximate an upper surface of the substrate 108. A plurality of emitter regions 126 of a highly doped n-type conductivity and a plurality of highly doped p-type regions 128 are formed between the first metal electrode 110 and the base region 124. A plurality of trench gates 130 are provided adjacent the emitter regions 126 and extending below the base region 124. Each trench gate 130 includes conductive gate material, e.g., polysilicon, provided in a trench 131. A gate insulation film 132 is formed on the sidewalls of the trench. A capping layer 136 of insulation material is formed on top of the trench 131 to protect the gate material provided in the trench. A barrier metal layer (not shown) may be provided over the capping layer and the emitter regions 126 to prevent diffusion of impurities into the gate and the emitter regions from the first metal electrode 110.

In an embodiment, the diode 104 is defined proximate an edge of the substrate 108, next to the guard region 106. The diode 104 includes an anode 138 provided proximate the upper surface of the substrate 108 and the cathode 122 provided proximate a backside of the substrate 108. In an embodiment, the anode 138 is a highly doped p-type region. The anode is electrically coupled to the first metal electrode 110. In an embodiment, the power device 100 includes a plurality of anodes. The cathode 122 is electrically coupled to the second metal electrode 112.

In an embodiment, an N buffer layer (not shown) of n-type region may be provided at the bottom portion of the substrate 108 over the collector 120 and the cathode 122. The N buffer layer is doped higher than the substrate 108, which is also of n-type conductivity, and functions to stop the electric field in the presence of a blocking voltage and prevent penetration of the electric field into the collector.

Figure 1B:
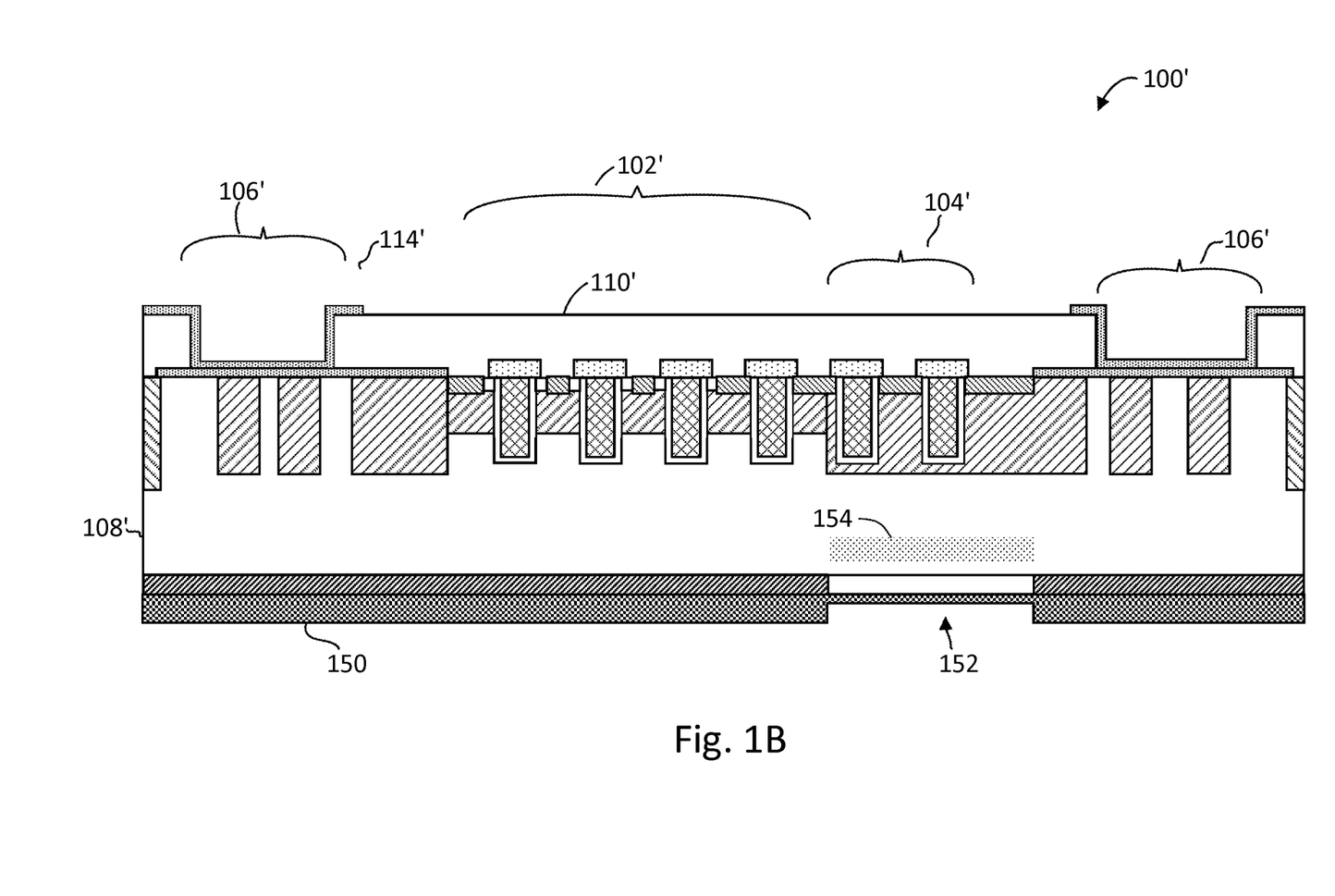
FIG. 1B illustrates a power semiconductor device according to another embodiment.

FIG. 1B illustrates a power semiconductor device 100' according to an embodiment. The power semiconductor device 100' has a switch 102', a diode 104', and a guard region 106'. In an embodiment, the switch 102' is an IGBT and the diode 104' is a fast recovery diode provided adjacent to the guard region 106'. The IGBT 102' and the diode 104' are formed on a monolithic chip or substrate 108'. A first metal electrode 110' is provided on a front side of the power device 100'.

A second metal layer 150 is provided on a backside of the substrate 108'. The second metal layer 150 serves as a collector electrode and a cathode electrode. The second metal layer has a groove 152 that is positioned below the diode region. In an embodiment, the second metal layer 150 has a thickness of about 8-12 um, preferably about 10 um over the IGBT region and a thickness of 3-7, preferably about 5 um over the diode region. In an embodiment, the second metal electrode 150 includes aluminum, titanium, nickel, and silver layers, where the aluminum layer is the thickest layer and is etched to form the groove 152. In another embodiment, the silver layer is the thickest layer and is etched to form the groove 152.

Using the thickness differences of the second metal electrode 150 and controlling the implantation energy, helium ions are implanted into the diode region to form a zone 154 in the drift layer to provide lifetime control in the diode region while keeping the IGBT region substantially free of the helium ions. The thicker layer of the second metal layer 150 protects the IGBT region during the helium ion irradiation step.

Figure 2:
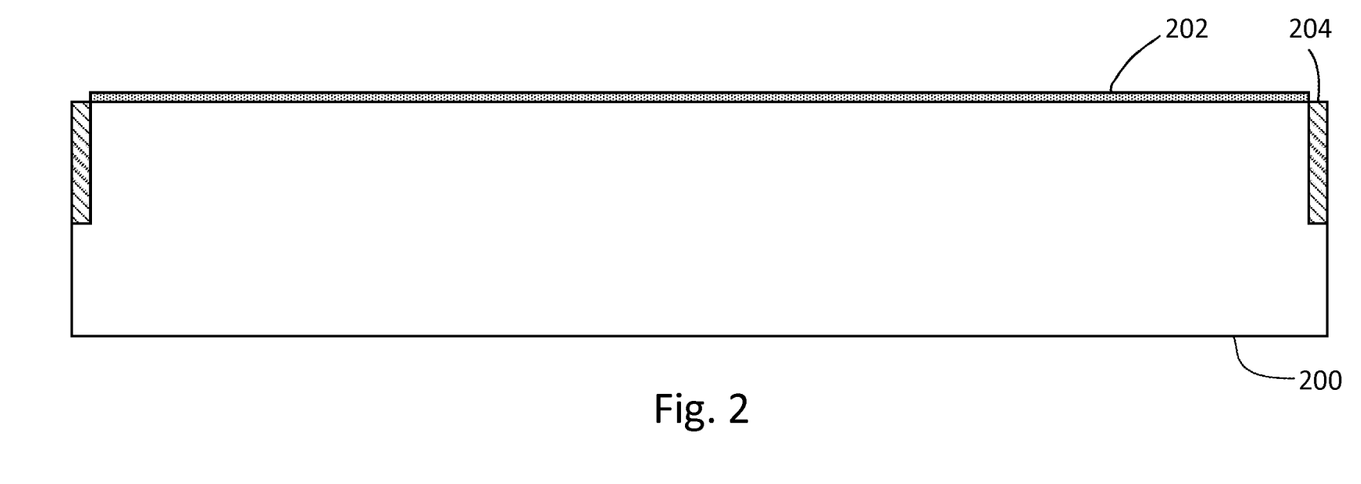
FIGS. 2-10 illustrate a method for fabricating a power semiconductor device having an IGBT and a diode according to an embodiment.

FIGS. 2-10 illustrate a method for fabricating a power semiconductor device having an IGBT and a diode according to an embodiment. The power device is made by performing a lifetime control treatment from the front side of the power device. A semiconductor substrate 200 having an n-type conductivity is provided (FIG. 2). A first mask layer 202 is provided on the upper surface of the substrate 200. The mask layer may be an oxide, photoresist, or the like. A guard ring 204 is formed around the substrate. The guard ring provides electrical isolation and structural integrity for the power device to be formed.

Figure 3:
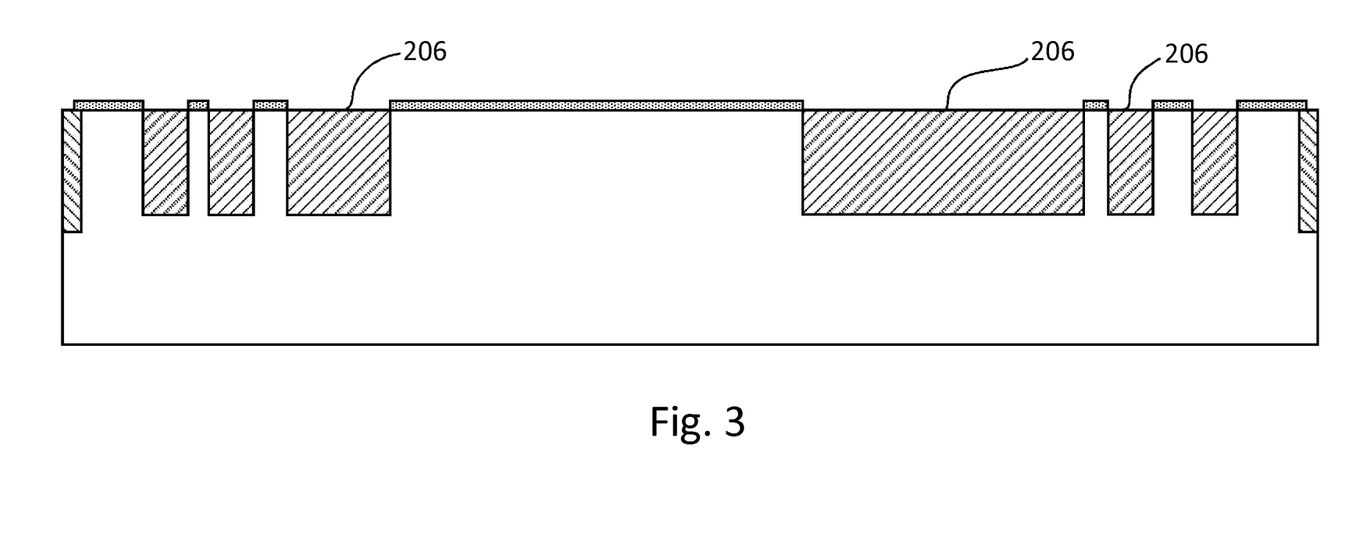

The first mask layer 202 is patterned to selectively expose certain areas of the substrate 200 (FIG. 3). P-type dopants (e.g., boron) are implanted into the exposed areas to form a plurality of p-type regions 206 having a depth of 5 um to 8 um for a 600V power device.

Figure 4:
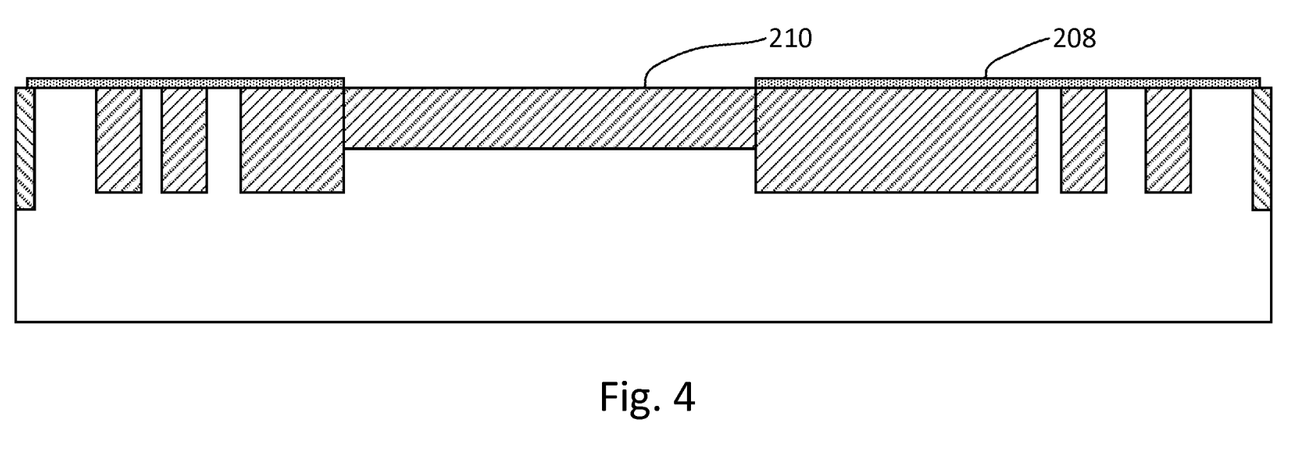

A second mask layer 208 is formed on the surface of the substrate 200 after removing the patterned first mask layer 202 (FIG. 4). The second mask layer 208 is patterned to expose a selected area of the substrate 200. P-type dopants (e.g., boron) are implanted into the exposed area to form a p-type base region or well 210. The base region 210 defines an area where an IGBT will be formed. In an implementation, the implantation step uses an acceleration voltage of about 100 keV, the base region may be provided with a dopant concentration of about $1.5 \times 10^{13}$ atoms/cm$^2$. Alternatively, the implantation step may use an acceleration voltage of about 50 keV to 200 keV, and the base region may be provided with a dopant concentration of about $1 \times 10^{13}$ to $1 \times 10^{14}$ atoms/cm$^2$. An annealing step may be performed to diffuse the implanted dopants to improve the dopant concentration profile.

Figure 5:
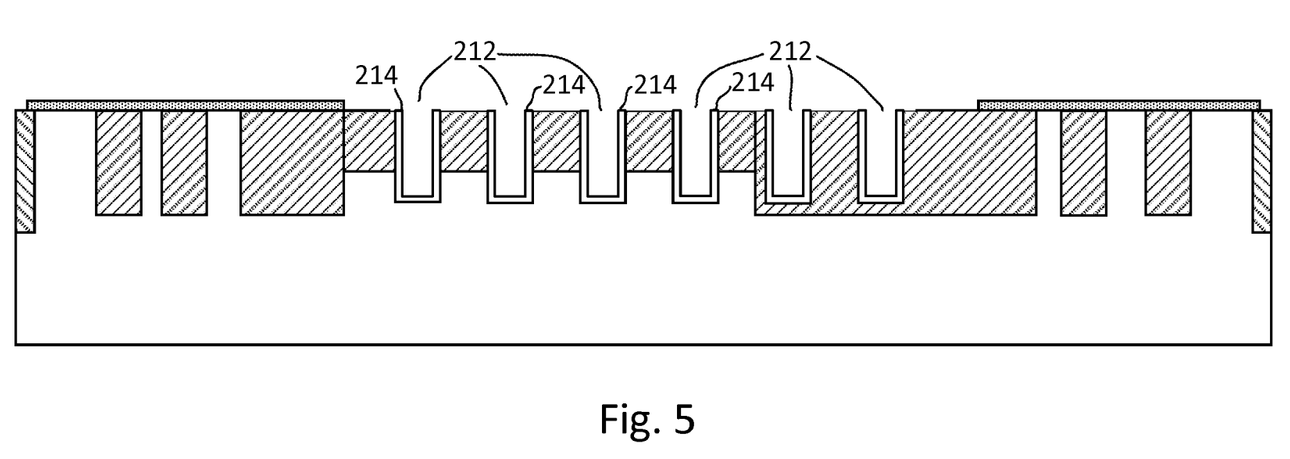

Referring to FIG. 5, a third mask layer (not shown) is formed over the surface of the substrate. The third mask layer is patterned to expose selected areas of the substrate. Exposed surface areas of the substrate are etched to form a plurality of trenches 212. A gate insulation film 214, e.g., gate oxide, is formed on the trenches.

Figure 6:
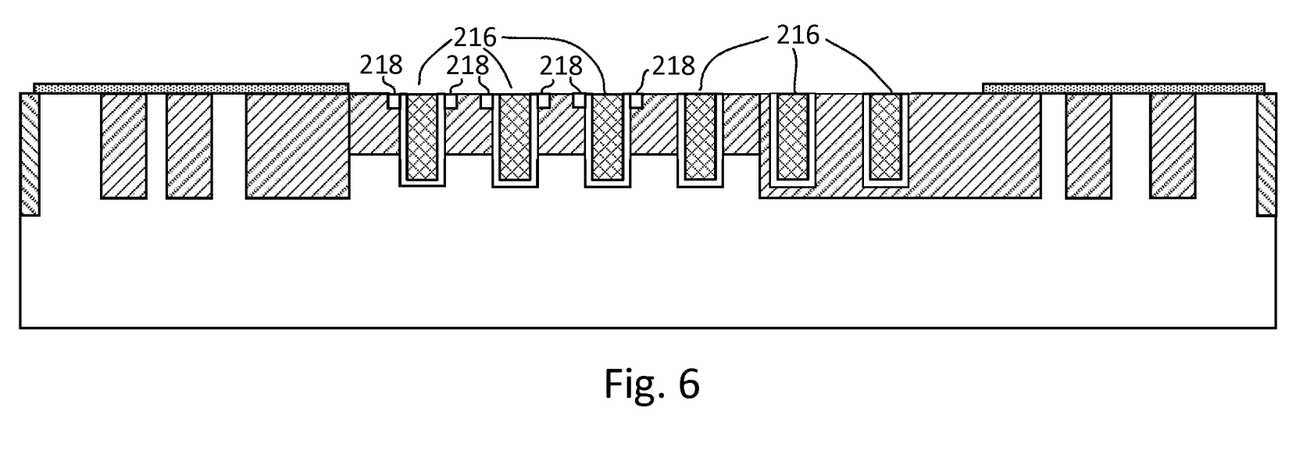

A conductive material 216 is deposited in the trenches 212 and etched to form gates (FIG. 6). In an embodiment, the conductive material is polysilicon. A selective implantation is performed to form a plurality of n-type surface doped regions 218 adjacent to the gates at the upper surface of the substrate, e.g., arsenic ions are implanted at energy of about 130 keV. The regions 218 are highly-doped n-type regions and serve as emitter regions for an IGBT to be formed. In an embodiment, the emitter regions 218 have a dopant concentration of $4 \times 10^{15}$ atoms/cm$^2$. Typically, the dopant concentration is provided to be greater than $1 \times 10^{15}$ atoms/cm$^2$.

Figure 7:
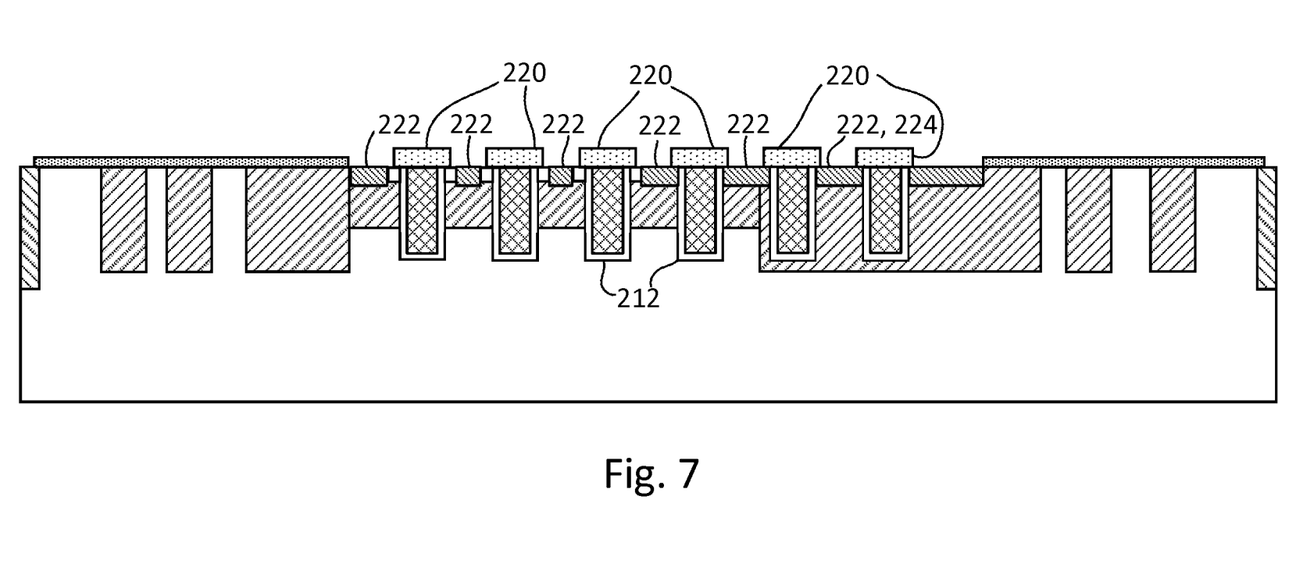
Figure 8:
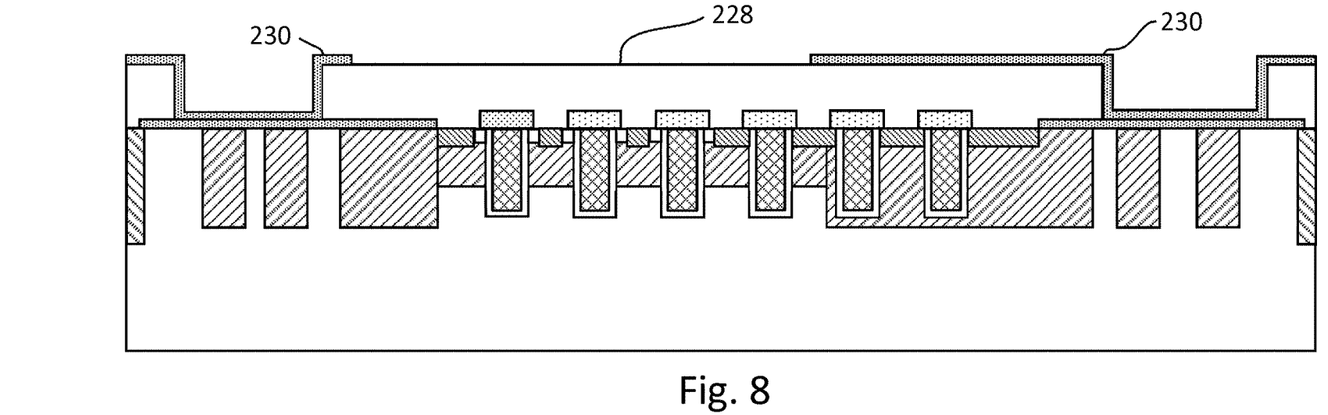

Referring FIG. 7, an inter-level dielectric layer is formed over the substrate and etched to form a plurality of capping layers 220 on top of the trenches 212 to protect the gate material provided therein. A plurality of p-type surface doped regions 222 is formed by introducing impurities of the p-type (e.g., boron) into the base region. In an embodiment, p-type surface doped regions 222 are highly-doped regions and have a dopant concentration of $1 \times 10^{15}$ atoms/cm$^2$ or greater. The boron ions may be implanted using multiple implantation steps, e.g., a first implantation step using energy of about 90 keV for a dopant concentration of $1 \times 10^{15}$ atoms/cm$^2$ and a second implantation step using energy of 20 keV for a dopant concentration of $3 \times 10^{15}$ atoms/cm$^2$. The highly-doped p-type region 222 in the diode region functions as an anode 224 of a diode to be formed. A first metal layer is deposited over the upper surface of the substrate (FIG. 8). The metal is patterned to form an electrode 228 for the emitter regions 218 and the anode 224. In an embodiment, the electrode 228 is aluminum and has a thickness of about 4 um, but its thickness may vary from 2 um to 6 um depending on implementation. In an implementation, a jacket layer may be deposited and etched to form a jacket 230 at the edges of the substrate. The jacket may be made of silicon nitride or the like and is used to prevent penetration of moisture and/or impurities into the substrate.

Figure 9:
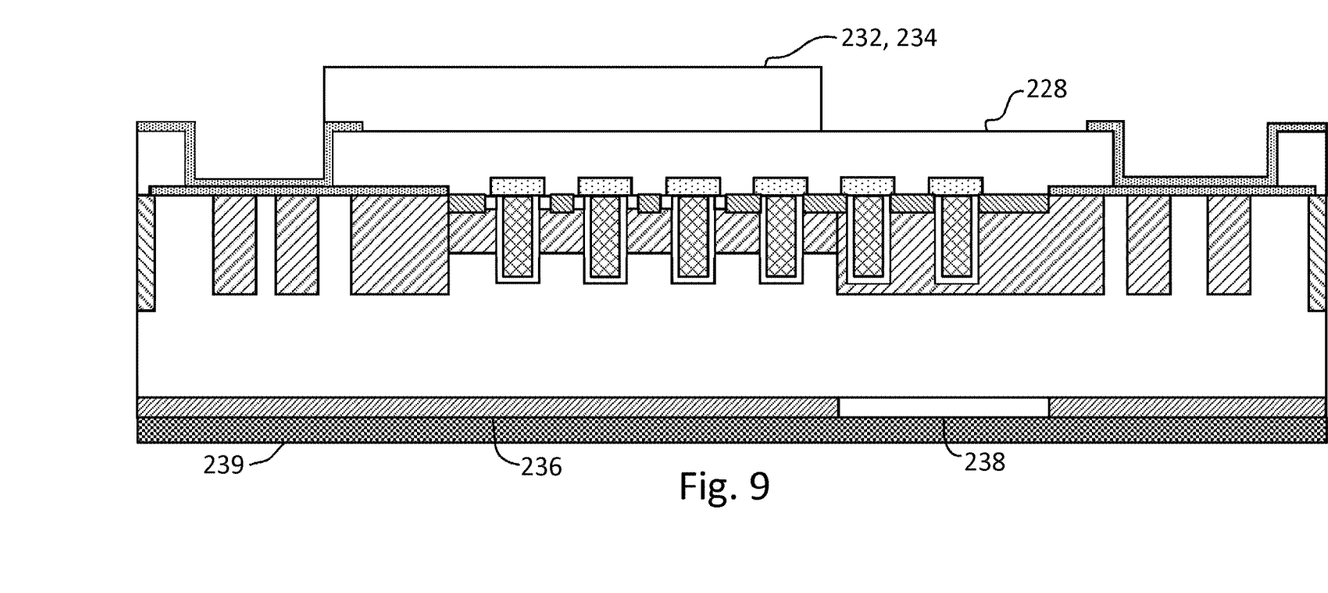

A layer 232 is deposited over the electrode 228 (FIG. 9). The layer is etched to form an implantation mask 234 that overlies the IGBT region, but not the diode region and the guard region. The implantation mask 234 serves to protect the IGBT region when impurities (e.g., helium ions) are implanted into the diode region during the lifetime control treatment process. The implantation mask 234, accordingly, has sufficient density and thickness to prevent impurities from penetrating into the substrate in the IGBT region during a subsequent implantation step.

In an embodiment, the layer 232 is metal, e.g., aluminum and has a thickness of 4 um or greater, e.g., 5 um. The thickness may be 3 um to 6 um depending on implementation. In an embodiment, the electrode 228 and the implantation mask 234 are made of the same material, e.g., aluminum, for fabrication convenience. Moreover, since photolithography is used to form the implantation mask (or metal pattern) 234, it is possible to have a precise alignment for a subsequent implantation step for lifetime control, e.g., less than 1 um in alignment deviation. However, if a conventional metal plate is used, the positional deviation can be significantly greater (e.g., about 100 um) since the plate is placed on the power device mechanically or manually. This large positional deviation can be problematic for integrated power devices having small dimensions.

A backside of the substrate is grinded to desired thickness and planarity. P-type dopants (e.g., boron) are implanted into the bottom surface to form a collector 236 for the IGBT. N-type dopants (e.g., phosphorus) are implanted into the diode region to form a cathode 238 on the bottom surface of the substrate. A metal layer 239 is formed over the backside of the substrate 200. The metal layer 239 serves as an electrode for the collector 236 and the cathode 238. In an embodiment, the metal layer 239 has a thickness of about 1-3 um. The metal layer may include a plurality of metal layers. In an embodiment, the metal layer 239 has a thickness of about 2 um, e.g., an aluminum (Al) layer of about 800 nm formed over the substrate, a titanium (Ti) layer of about 150 nm formed over the Al layer, a nickel (Ni) layer of about 200 nm over the Ti layer, and a silver (Ag) layer of about 800 nm formed over the Ni layer.

Figure 10:
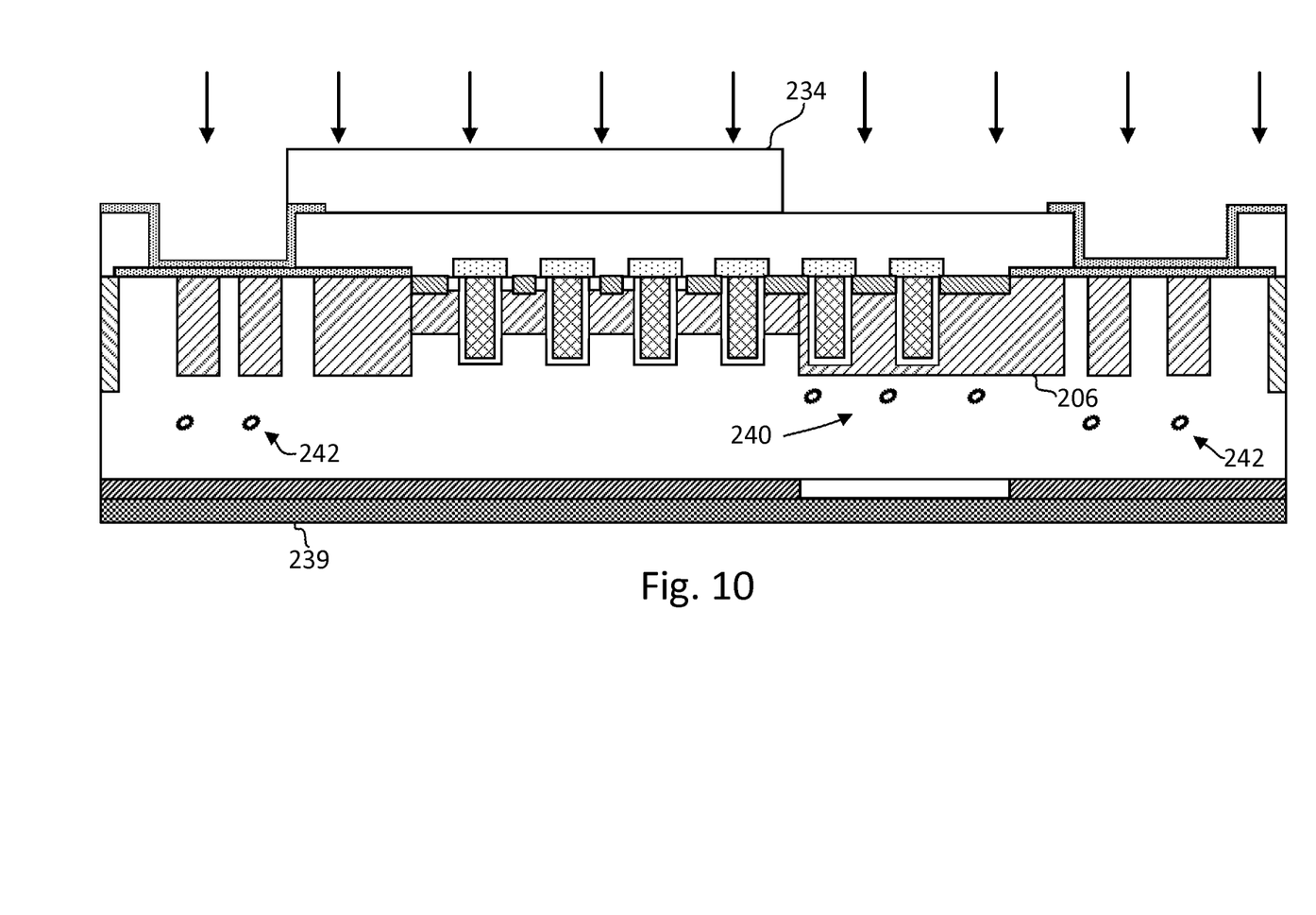

FIG. 10 illustrates a lifetime control treatment process for optimizing the performance of IGBT and the diode (e.g., fast recovery diode or FRD) according to an embodiment. Impurities (e.g., helium ions) are implanted into the diode region to improve operating characteristics of the diode, e.g., switching speed of the diode. However, the IGBT region needs to be protected so that these impurities will not be implanted therein. Otherwise the forward performance of the IGBT would deteriorate. The implantation mask (or metal pattern) 234 is used for this step. The metal pattern 234 prevents the impurities from being implanted into the IGBT region.

An implantation energy is selected so that helium ions are implanted below the p-region 206 to form a carrier lifetime zone 240. In an embodiment, the implantation energy is controlled so that helium ions are injected to a depth of 2 um to 10 um from the backside of the substrate.

The distance between the zone 240 and the p-region 206 may be between 1 μm to 10 μm, preferably about 2-3 um. Annealing may be performed after the implantation step to stabilize the distribution of the recombination centers generated by the helium implants, e.g., at a temperature between 220° C. to 350° C. for a few hours.

In an embodiment, the implantation mask pattern 234 only covers the IGBT region. The guard region is implanted with helium ions, as a result, during the lifetime control treatment. A zone 242 is formed in the substrate.

A power device that has been manufactured according to the above embodiment is illustrated in FIG. 1A. In an embodiment, the power device includes a metal pattern of the same material having two different thickness: (1) a first thickness of about 4 um provided over the diode region and (2) a second thickness of about 9 um provide over the IGBT region. In an embodiment, the first thickness is 2-6 um, and the second thickness is 4-15 um. The thicker metal layer serves as an implantation blocking pattern (or implantation mask) during the lifetime control treatment, so that helium ions are not implanted in the IGBT region. As a result, the power device includes a carrier lifetime zone (e.g., zone 116) to improve switching speed of the diode.

Figure 11:
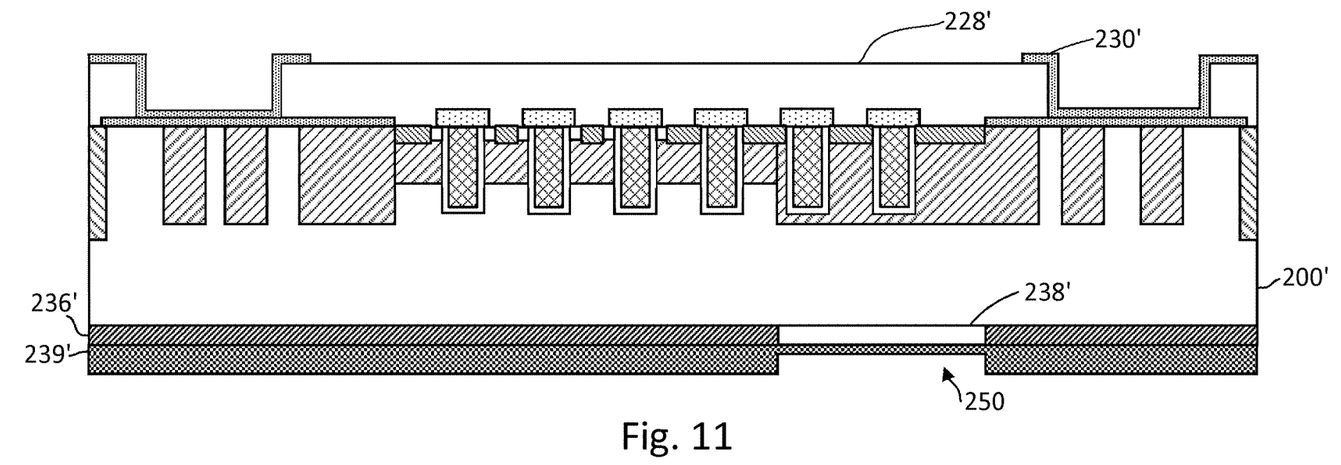
FIGS. 11-12 illustrate a method for fabricating a power semiconductor device according to another embodiment.
Figure 12:
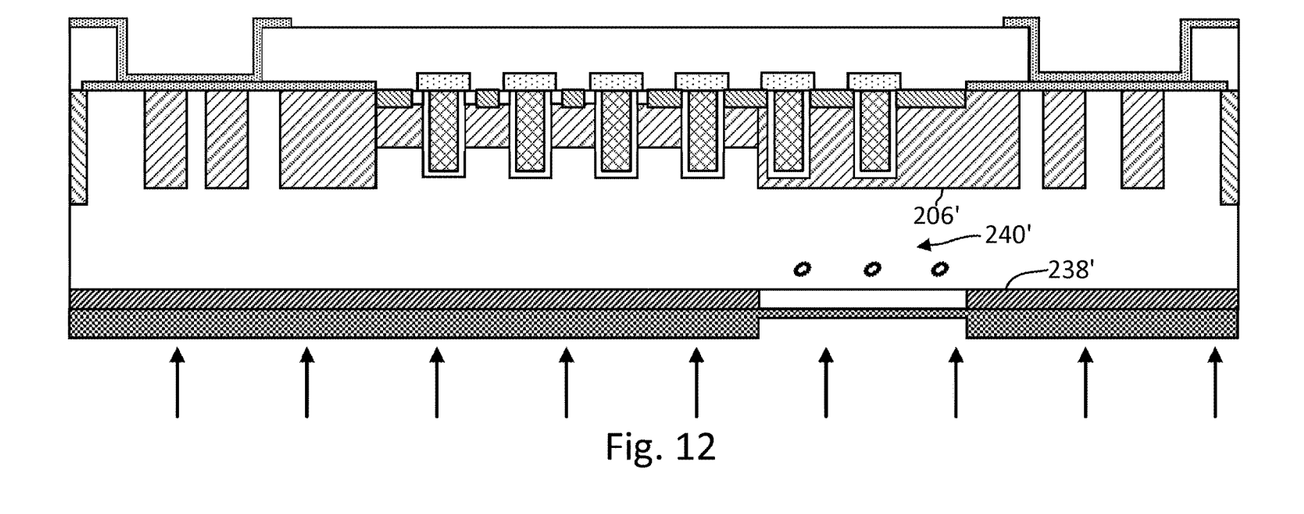

FIGS. 11-12 illustrate a method for fabricating a power semiconductor device having an IGBT and a diode according to another embodiment. The power device is made by performing a lifetime control treatment from the back side of the power device. The fabrication process is substantially the same until the first metal layer 226 is patterned to form the electrode 228 in FIG. 8. Accordingly, these earlier process steps will not be described in interest of brevity.

Referring to FIG. 11, after forming an electrode 228' (and optionally a jacket 230'), a backside of a substrate 200' is grinded to provide the substrate 200' with a desired thickness and planarity. P-type dopants (e.g., boron) are implanted into the bottom surface to form a collector 236' for the IGBT. N-type dopants (e.g., phosphorus) are implanted into the diode region to form a cathode 238' on the bottom surface of the substrate.

A metal layer 239' is formed over the backside of the substrate 200' to a thickness of about 10-12 um. The metal layer 239' serves as an electrode for the collector 236' and the cathode 238'. The metal layer 239' may include a plurality of metal layers, e.g., an aluminum (Al) layer over the substrate, a titanium (Ti) layer over the aluminum layer, a nickel (Ni) layer over the titanium layer, and a silver (Ag) layer over the titanium layer. In an embodiment, the Al/Ti/Ni/Ag layers are deposited to thicknesses of about 800/150/200/9000 nm or to a total thickness of 10,150 nm or a little over 10 um. The Ag layer is etched at an area positioned below the diode region until about 4,000 nm or 4 um remains at that area, thereby forming a groove 250 having a thickness of about 5 um.

Accordingly, the metal layer 239' has at least two different thicknesses: a first thickness of about 5 um for a portion provided below the diode region (or the thickness of the groove 250) and a second thickness of about 10 um for a portion provided below the IGBT region. In an embodiment, the first thickness is 4-6 um, and the second thickness is 8-12 um.

In another embodiment, an Al layer of the metal layer 239' may be the thickest layer, and the groove 250 may be formed by etching the Al layer. For example, the Al layer is deposited to a thickness of about 9,000 nm (or 9 um) and etched at an area below the diode region until about 4,000 nm or 4 um remains at that area. A Ti layer of about 150 nm, a Ni layer of about 200 nm, and an Ag layer of about 800 nm are deposited sequentially, thereby forming a metal layer having a thickness of about 10 um below the IGBT region and a thickness of about 5 um below the diode region.

FIG. 12 illustrates a lifetime control treatment performed on the backside of the power device according to an embodiment. The thicker portion of the metal layer 239' protects the IGBT region while the impurities (e.g., helium ions) are being implanted into the diode region through the groove 250.

An implantation energy is selected so that helium ions are implanted in the diode region to form a carrier lifetime zone 240' while the IGBT region remains free of helium ions. Annealing may be performed after the implantation step to stabilize the distribution of the recombination centers generated by the helium implants.

A power device (e.g., power device 100') that has been manufactured according to the above embodiment is illustrated in FIG. 1B. In an embodiment, the power device includes a metal pattern with two different thickness. Unlike the power device of FIG. 1A, the power device 100' has the metal pattern with the different thicknesses provided on the backside to facilitate the lifetime control treatment to be performed from the backside.

Aspects of the present disclosure have been described in conjunction with the specific embodiments thereof that are proposed as examples. Numerous alternatives, modifications, and variations to the embodiments as set forth herein may be made without departing from the scope of the claims set forth below. For example, a power device may have a metal pattern with different thicknesses on the front side and another metal pattern with different thicknesses on the backside to enable lifetime control treatment to be performed from the both sides. Accordingly, embodiments as set forth herein are intended to be illustrative and not limiting.

What is claimed is:

1. A power device, comprising:
    a substrate including a drift layer and having a first region and a second region, the drift layer having impurities of a first type;
    a switch formed in the first region;
    a diode formed in the second region;
    a metal structure formed over a front side of the substrate, the metal structure includes an electrode and an implantation mask that is formed on the electrode, the metal structure having a first thickness over the first region of the substrate and a second thickness over the second region of the substrate, the first thickness and second thickness having at least 3 um in thickness difference; and
    a zone provided in the drift layer in the second region of the substrate, the zone having impurities of a second type that is different from the first type.

2. The power device of claim 1,
    wherein the zone is a carrier-lifetime zone configured to improve an operational characteristic of the diode.

3. The power device of claim 2, wherein the electrode and the implantation mask include the same metal.

4. The power device of claim 2, wherein the electrode and the implantation mask include aluminum.

5. The power device of claim 1, wherein the switch is a reverse-conducting insulated-gate bipolar transistor (IGBT).

6. The power device of claim 1, wherein the first thickness is at least 8 um, and the second thickness is at least 4 um.

7. A power device, comprising:
    a substrate including a drift layer and having a first region and a second region, the drift layer having impurities of a first type;
    a switch formed in the first region;
    a diode formed in the second region;
    a metal structure formed over a surface of the substrate, the metal structure having a first thickness over the first region of the substrate and a second thickness over the second region of the substrate, the first thickness and second thickness having at least 3 um in thickness difference; and
    a zone provided in the drift layer in the second region of the substrate, the zone having impurities of a second type that is different from the first type,
    wherein the surface of the substrate is a backside of the substrate, and the metal structure is a metal layer having a groove configured to allow impurities to be implanted into the second region of the substrate to form the zone.

8. The power device of claim 1, wherein the diode is a fast recovery diode.

9. A power device, comprising:
    a switch provided in a first region of a substrate;
    a diode formed in a second region of the substrate;
    first and second metal electrodes formed over first and second surfaces of the substrate, respectively;
    an implantation mask formed on the first metal electrode to prevent impurities from being implanted into the first region; and
    a zone provided in the second region of the substrate, the zone having impurities implanted in the second region to improve a switching speed of the diode,
    wherein a metal structure includes the implantation mask and the first metal electrode, the metal structure having a first thickness over the first region of the substrate and a second thickness over the second region of the substrate, the first thickness and second thickness having at least 3 um in thickness difference.

10. The power device of claim 9, wherein the implantation mask is a metal pattern formed on the first metal electrode.

11. The power device of claim 10, wherein the implantation mask includes aluminum.

12. The power device of claim 11, wherein the implantation mask has a thickness greater than that of the first metal electrode and the switch is an insulated-gate bipolar transistor (IGBT).

13. The power device of claim 11, wherein the implantation mask has a thickness of at least 4 um.

14. The power device of claim 11, wherein the implantation mask covers only the first region of the substrate wherein the IGBT is formed.

15. The power device of claim 11, further comprising: a drift layer provided in the substrate, the drift layer having impurities of a first type, wherein the impurities in the zone are a second type that is different from the first type.

16. The power device of claim 9, further comprising:
    a drift layer provided in the substrate, the drift layer having impurities of a first type; and
    an impurity region having impurities of a second type and provided over the zone in the second region of the substrate,
    wherein the impurities in the zone are the second type that is different from the first type.

17. The power device of claim 16, wherein a distance between the impurity region and the zone being between 1 um to 10 um.

18. The power device of claim 9, wherein the implantation mask has a thickness greater than that of the first metal electrode and the switch is an insulated-gate bipolar transistor (IGBT).

19. The power device of claim 18, wherein the implantation mask covers the first region of the substrate where the IGBT is formed without covering the second region of the substrate.

20. The power device of claim 1, wherein the electrode is a first electrode, the device further comprising a second electrode formed over a backside of the substrate.

* * * * *